(12) United States Patent
Sung

(10) Patent No.: US 7,846,767 B1
(45) Date of Patent: Dec. 7, 2010

(54) SEMICONDUCTOR-ON-DIAMOND DEVICES AND ASSOCIATED METHODS

(76) Inventor: Chien-Min Sung, 4, Lane 32, Chung-Cheng Road, Tansui, Taipei County 251 (TW)

( * ) Notice: Subject to any disclaimer, the term of this patent is extended or adjusted under 35 U.S.C. 154(b) by 395 days.

(21) Appl. No.: 11/899,953

(22) Filed: Sep. 6, 2007

(51) Int. Cl.
*H01L 21/00* (2006.01)

(52) U.S. Cl. .................. 438/105; 438/977; 257/77; 257/E21.041

(58) Field of Classification Search ............... 438/105, 438/977; 257/77, E21.041
See application file for complete search history.

(56) References Cited

U.S. PATENT DOCUMENTS

| | | | |
|---|---|---|---|
| 4,952,832 A | 8/1990 | Imai et al. | |
| 4,981,818 A | 1/1991 | Anthony et al. | |
| 4,988,421 A | 1/1991 | Drawl et al. | |
| 5,130,103 A | 7/1992 | Yamagata et al. | |
| 5,130,111 A | 7/1992 | Pryor | |
| 5,131,963 A | 7/1992 | Ravi | |
| 5,173,089 A | 12/1992 | Tanabe et al. | |
| 5,186,785 A | 2/1993 | Annamalai | |
| 5,221,870 A | 6/1993 | Nakahata et al. | |
| 5,246,884 A | 9/1993 | Jaso et al. | |
| 5,329,208 A | 7/1994 | Imai et al. | |
| 5,355,568 A | 10/1994 | Imai et al. | |
| 5,366,579 A | 11/1994 | Yamazaki et al. | |
| 5,374,293 A | 12/1994 | Takashita et al. | |
| 5,380,349 A | 1/1995 | Taniguchi et al. | |
| 5,390,401 A | 2/1995 | Shikata et al. | |
| 5,391,895 A | 2/1995 | Dreifus | |
| 5,401,544 A | 3/1995 | Nakahata et al. | |
| 5,402,029 A | 3/1995 | Nakamura et al. | |
| 5,440,189 A | 8/1995 | Nakahata et al. | |
| 5,446,329 A | 8/1995 | Nakahata et al. | |
| 5,562,769 A | 10/1996 | Dreifus et al. | |
| 5,576,589 A | 11/1996 | Dreifus et al. | |
| 5,633,088 A | 5/1997 | Pinneo | |
| 5,643,641 A | 7/1997 | Turchan et al. | |
| 5,652,436 A | 7/1997 | Stoner et al. | |
| 5,656,828 A | 8/1997 | Zachai et al. | |

(Continued)

FOREIGN PATENT DOCUMENTS

EP 0 696 819 2/1996

(Continued)

OTHER PUBLICATIONS

Choi K.H. et al., "Effect of Dielectric Layer in ZnO/Dielectric/Si Layered Structure on GSAW and HVPSAW Propagation Properties", 2000 IEEE Ultrasonics Symposium, Reference No. 0-7803-6868-6/00, pp. 1-4.

*Primary Examiner*—Amir Zarabian
*Assistant Examiner*—Christy L Novacek
(74) *Attorney, Agent, or Firm*—Thorpe North & Western LLP

(57) ABSTRACT

Semiconductor-on-diamond (SOD) substrates and methods for making such substrates are provided. In one aspect, a method of making an SOD device is provided that includes etching depressions into an etch surface of a semiconductor substrate to a uniform depth, depositing a diamond layer onto the etch surface to form diamond-filled depressions, and thinning the semiconductor substrate at a thinning surface opposite the etch surface until the diamond filled depressions are exposed, thus forming a semiconductor device having a thickness substantially equal to the uniform depth.

15 Claims, 2 Drawing Sheets

U.S. PATENT DOCUMENTS

| | | | |
|---|---|---|---|
| 5,660,881 A | 8/1997 | Okamura | |
| 5,776,246 A | 7/1998 | Tanabe et al. | |
| 5,776,355 A | 7/1998 | Martin | |
| 5,827,613 A | 10/1998 | Nakayama et al. | |
| 5,843,224 A | 12/1998 | Zachai et al. | |
| 5,846,320 A | 12/1998 | Matsuyama et al. | |
| 5,920,143 A | 7/1999 | Tarui et al. | |
| 5,925,154 A | 7/1999 | Semenov et al. | |
| 6,022,622 A | 2/2000 | Domoto et al. | |
| 6,039,641 A | 3/2000 | Sung | |
| 6,051,063 A | 4/2000 | Tanabe et al. | |
| 6,054,719 A | 4/2000 | Fusser et al. | |
| 6,057,602 A | 5/2000 | Hudson et al. | |
| 6,121,066 A * | 9/2000 | Ju et al. | 438/20 |
| 6,159,604 A | 12/2000 | Adachi | |
| 6,210,780 B1 | 4/2001 | Fujii et al. | |
| 6,222,299 B1 | 4/2001 | Graebner et al. | |
| 6,248,394 B1 | 6/2001 | Du et al. | |
| 6,275,123 B1 | 8/2001 | Tanaka et al. | |
| 6,278,342 B1 | 8/2001 | Ella | |
| 6,356,006 B1 | 3/2002 | Fujii et al. | |
| 6,448,688 B2 | 9/2002 | Fujii et al. | |
| 6,466,105 B1 | 10/2002 | Lobl et al. | |
| 6,531,226 B1 | 3/2003 | Petkie | |
| 6,592,436 B1 | 7/2003 | Abe et al. | |
| 6,659,161 B1 | 12/2003 | Sung | |
| 6,710,513 B2 | 3/2004 | Nakahata et al. | |
| 6,814,130 B2 | 11/2004 | Sung | |
| 6,830,813 B2 | 12/2004 | Ravi | |
| 6,936,497 B2 * | 8/2005 | Ravi et al. | 438/105 |
| 7,011,134 B2 | 3/2006 | Sung | |
| 7,084,432 B2 * | 8/2006 | Kachi et al. | 257/81 |
| 7,132,309 B2 | 11/2006 | Sung | |
| 2003/0160542 A1 | 8/2003 | Bi et al. | |
| 2006/0174823 A1 * | 8/2006 | Sung | 117/84 |
| 2006/0186556 A1 | 8/2006 | Sung | |
| 2006/0249748 A1 * | 11/2006 | Piner et al. | 257/183 |
| 2008/0087891 A1 | 4/2008 | Sung | |

FOREIGN PATENT DOCUMENTS

| | | |
|---|---|---|
| EP | 0930702 | 7/1999 |
| GB | 2 292 253 | 2/1996 |
| JP | 06276049 A | 9/1994 |
| WO | WO 93/01617 | 1/1993 |
| WO | WO 94/08077 | 4/1994 |

* cited by examiner

SEMICONDUCTOR-ON-DIAMOND DEVICES AND ASSOCIATED METHODS

FIELD OF THE INVENTION

The present invention relates generally to methods of making substrates having a semiconductor layer associated with a diamond substrate, as well as associated devices. Accordingly, the present invention involves the chemical and material science fields.

BACKGROUND OF THE INVENTION

As computers and other electronic devices become smaller and faster, the demands placed on semiconductor devices utilized therein increase geometrically. Ultra-large-scale integration (ULSI) is a technology that places at least 1 million circuit elements on a single semiconductor chip. In addition to the tremendous density issues that already exist, with the current movement toward size reduction, ULSI is becoming even more delicate, both in size and materials than ever before. As current technology moves beyond ULSI, several barriers emerge that may be insurmountable with current wafer and substrate materials.

One barrier arises due to the accumulation of heat that may not be effectively channeled out of the crystal lattice of Group IV semiconductors. Semiconductors tend to have thermal conductivities that are a fraction of copper metal. Hence, semiconductor devices are often cooled with copper heat spreaders. However, as the power requirements future generations of semiconductor devices increase, copper heat spreaders will become reservoirs for heat accumulation.

Another barrier arises due to the accumulation of charge carriers, i.e. electrons and holes, which are intrinsic to quantum fluctuation. Accumulation of the carriers creates noise, and tends to obscure electrical signals within the semiconductor device. This problem is compounded as the temperature of the device increases. Much of the carrier accumulation may be due to the intrinsically low bonding energy and the directional anisotropy of typical semiconductor crystal lattices.

Yet another barrier may be a further result of current semiconductor materials. These materials tend to have a high leaking current and a low break down voltage. As the size of semiconductor transistors and other circuit elements decrease, coupled with the growing need to increase power and frequency, current leak and break down voltage also become critical.

As power and frequency requirements increase and the size of semiconductor components decreases, the search for materials to alleviate these problems becomes crucial to the progress of the semiconductor industry. One material that may be suitable for the next generation of semiconductor devices is diamond. The physical properties of diamond, such as its high thermal conductivity, low intrinsic carrier concentration, and high band gap make it a desirable material for use in many high-powered electronic devices.

The semiconductor industry has also recently expanded efforts in producing silicon-on-insulator (SOI) devices. These devices allow for electrical insulation between an underlying substrate and any number of useful semiconductor devices. Typically, these SOI devices utilize insulating layers with poor thermal conductivity, a high degree of thermal expansion mismatch, and/or difficulties in the epitaxial growth of silicon or other semiconductor materials.

SUMMARY OF THE INVENTION

Accordingly the present invention provides semiconductor-on-diamond (SOD) devices and methods for making such devices. In one aspect, a method of making an SOD device is provided that includes etching depressions into an etch surface of a semiconductor substrate to a uniform depth, depositing a diamond layer onto the etch surface to form diamond-filled depressions, and thinning the semiconductor substrate at a thinning surface opposite the etch surface until the diamond filled depressions are exposed, thus forming a semiconductor device having a thickness substantially equal to the uniform depth. The uniform depth of the etched depressions can vary, depending on the intended use of the SOD device and the particular materials used. As such, any uniform depth would be considered to be within the present scope. In one aspect, however, the uniform depth is less than about 5 µm. In another aspect, the uniform depth is less than about 2 µm. In yet another aspect, the uniform depth is less than about 1 µm. As such, the resulting thinned semiconductor substrate has a uniform thickness that corresponds to the uniform depth of the etched depressions. Additionally, the degree of uniformity of the thickness of the thinned semiconductor substrate corresponds to the uniformity of the depth of the etched depressions. While numerous uniformity tolerances are contemplated, in one aspect the thinned semiconductor substrate has a variance from a uniform thickness of less than 0.25 µm. In another aspect, the thinned semiconductor substrate has a variance from a uniform thickness of less than 0.1 µm. In yet another aspect, the thinned semiconductor substrate has a variance from a uniform thickness of less than 0.05 µm.

The semiconductor substrate of the SOD device will ultimately become the attachment surface for other materials in the construction of specific semiconductor devices. As such, the materials used in making the semiconductor substrate may vary depending on the particular semiconductor device being constructed. As such, the scope of the present invention should not be limited by such materials. Non-limiting examples of such materials may include, BN, GaN, InN, Si, SiC, and combinations thereof. In one specific aspect, the semiconductor substrate is GaN. In another specific aspect, the semiconductor substrate is Si. In yet another specific aspect, the semiconductor substrate is sapphire.

Following the thinning of the semiconductor substrate, a semiconductor layer may be deposited on the thinning surface of the semiconductor substrate. Various semiconductor materials are contemplated for use in devices incorporating the substrates according to aspects of the present invention. It should be noted that any useful semiconductor material would be considered to be within the scope of the claims of the present invention. In one aspect, non-limiting examples of semiconductor layer materials may include AlN, BN, GaN, InN, Si, SiC, and combinations thereof. In one specific aspect, for example, the semiconductor layer may be Si. In another specific aspect the semiconductor layer may be GaN.

Various configurations of diamond layers are contemplated, all of which would be considered to be within the present scope. Similarly, various methods of deposition of the diamond layer are possible. In one aspect, for example, depositing the diamond layer may further include depositing a conformal diamond layer onto the etch surface and thickening the conformal diamond layer to form the diamond layer.

DETAILED DESCRIPTION

Figure 1:
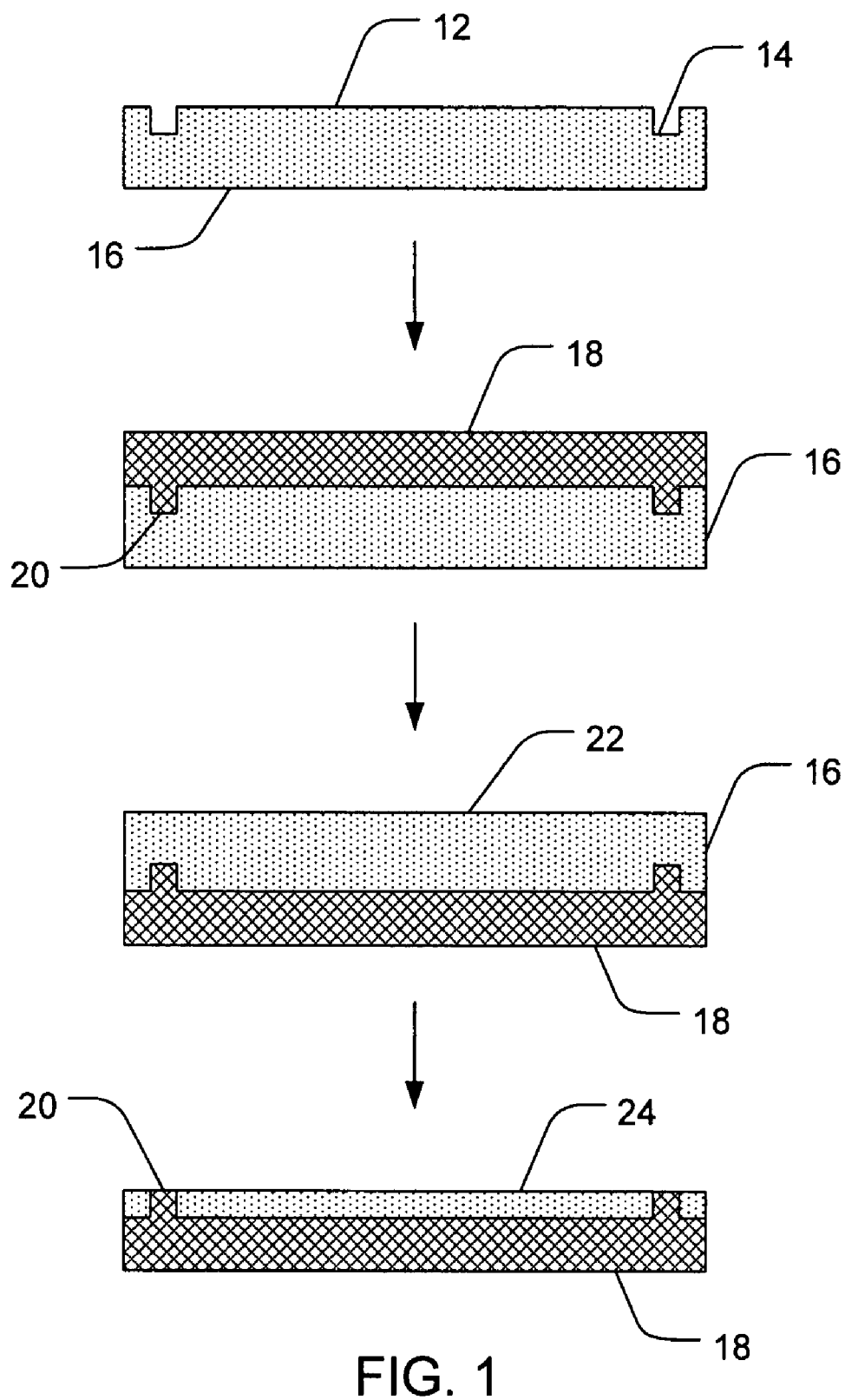
FIG. 1 is a sequential depiction of a method of making an SOD device in accordance with one embodiment of the present invention.

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural referents unless the context clearly dictates otherwise. Thus, for example, reference to "a diamond layer" includes one or more of such layers, reference to "a carbon source" includes reference to one or more of such carbon sources, and reference to "a CVD technique" includes reference to one or more of such CVD techniques.

DEFINITIONS

In describing and claiming the present invention, the following terminology will be used in accordance with the definitions set forth below.

As used herein, the terms "substrate" and "semiconductor substrate" refer to support surfaces to which various materials can be joined in forming a semiconductor-on-diamond (SOD) device. The substrate may be any shape, thickness, or material, required in order to achieve a specific result, and includes but is not limited to semiconductors, metals, alloys, ceramics, and mixtures thereof. Further, in some aspects, the substrate may be an existing semiconductor device or wafer, or may be a material which is capable of being joined to a suitable device.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond or other particles in a vapor form upon a surface. Various CVD techniques are well known in the art.

As used herein, "physical vapor deposition," or "PVD" refers to any method of physically depositing diamond particles in a vapor form upon a surface. Various PVD techniques are well known in the art.

As used herein, "growth side," and "grown surface" may be used interchangeably and refer to the surface of a film or layer which is grows during a deposition process.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "diamond layer" refers to any structure, regardless of shape, which contains diamond-containing materials which can be incorporated into a SOD device. Thus, for example, a diamond film partially or entirely covering a surface is included within the meaning of these terms. Additionally, a layer of a material, such as metals, acrylics, or composites, having diamond particles disbursed therein is included in these terms.

As used herein, "nucleation enhancer" refers to a material, which increases the quality of a diamond layer formed from a plurality of diamond nuclei using a CVD process. In one aspect, the nucleation enhancer may increase the quality of a diamond layer by reducing movement or immobilizing diamond nuclei. Examples of nucleation enhancers include without limitation, metals, and various metallic compounds, as well as carbides and carbide forming materials.

As used herein with respect to a nucleation enhancer layer, "thin" refers to the thickness or depth of the layer being sufficiently small so as to not substantially interfere with the transfer of the intended configuration from the interface surface configuration to the device surface. In one aspect, the thickness of the nucleation enhancer may be less than about 0.1 micrometers. In another aspect, the thickness may be less than 10 nanometers. In another aspect, the thickness may be less than about 5 nanometers.

As used herein, "grain boundaries" are boundaries in a crystalline lattice formed where adjacent seed crystals have grown together. An example includes polycrystalline diamond, where numerous seed crystals having grains of different orientations have grown together to form a heteroepitaxial layer.

As used herein, "crystal dislocations" or "dislocations" can be used interchangeably, and refer to any variation from essentially perfect order and/or symmetry in a crystalline lattice.

As used herein, "single crystal" refers to a crystalline material having a crystal lattice that is substantially free of crystal dislocations and/or grain boundaries.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason may be the extreme thinness of the layer.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

One type of substrate that may be useful in the semiconductor arts is a semiconductor-on-diamond (SOD) substrate. Such a substrate would include a diamond layer for heat dissipation coupled to a semiconductor substrate upon which semiconductor materials are deposited. In such cases, it is beneficial to thin the semiconductor substrate in order to maximize heat transfer from the semiconductor materials to the diamond layer. The process of thinning the semiconductor substrate is a difficult process, particularly for very thin layers of 5 µm or less. As the layer is thinned, it may often be punctured or cracked, thus ruining the work piece.

It has now been discovered that a beneficial SOD substrate for further deposition of semiconductor materials may be created having a diamond layer and a semiconductor substrate that can be readily thinned to thicknesses of less than 5 µm. Such an SOD substrate may include a diamond layer having a depression therein, and a semiconductor substrate disposed in the depression having a thickness of less than about 5 µm. The semiconductor substrate is thus situated in the depression such that the diamond layer surrounds and contacts the semiconductor substrate on at least 5 sides. Additionally, the semiconductor substrate may be polished flush with the diamond layer around the edges of the depression. In one aspect, for example, the semiconductor substrate may be thinned by grinding and polished via CMP processing.

Such an SOD substrate may be made in a variety of ways. In one aspect as is shown in FIG. 1, however, a method of making an SOD device may include etching depressions 14 into an etch surface 12 of a semiconductor substrate 16 to a uniform depth. Following creation of such depressions, a diamond layer 18 is deposited onto the etch surface 12 to form diamond-filled depressions 20 and a layer of diamond material between the diamond-filled depressions 20. The resulting diamond and semiconductor structure may then be optionally flipped over to expose the semiconductor substrate 16. The semiconductor substrate 16 may then be thinned at a thinning surface 22 opposite the etch surface until the diamond filled depressions 20 are exposed. A thinned semiconductor substrate 24 is thus formed having a thickness substantially equal to the uniform depth of the etching depressions 14. Subsequent deposition of semiconductor or other materials may then be performed on the thinned semiconductor substrate 24.

Various semiconductor substrates are contemplated, depending on the intended use of the SOD substrate. The semiconductor substrate material may be a material upon which diamond may readily be deposited, or it may be a material that requires a nucleation enhancing layer in order for the deposition of diamond to proceed. Additionally, it may also be beneficial for the semiconductor substrate to be a material upon which various semiconductor materials may be deposited. In one aspect, for example, the semiconductor substrate may include, without limitation, boron nitride, gallium nitride, indium nitride, silicon, silicon carbide, sapphire, gallium arsenide, and combinations thereof. In one specific aspect, the semiconductor substrate may be silicon. In another aspect, the semiconductor substrate may be gallium nitride. In yet another aspect, the semiconductor substrate may be sapphire. In yet a further aspect, the semiconductor substrate may be aluminum nitride.

As has been described, depressions having a uniform depth may be etched into a surface of the semiconductor substrate that will thus correspond to the thickness of the semiconductor substrate following thinning. Various methods of etching the depressions are contemplated, provided that the depressions have a uniform depth. In one aspect, for example, the depressions may be physically abraded into the semiconductor substrate. Such physical etching may include any physical abrading method known, including cutting with a blade or wheel, scratching with a stylus or other pointed tool, etc. Other possible techniques may include chemical etching, laser ablation, vapor dissolution, etc. In short, any method of etching a depression to a uniform depth on a scale required to produce very thin semiconductor substrates would be considered to be within the scope of the present invention.

Additionally, the depressions may be continuous or they may be discrete points or regions in the semiconductor substrate. For example, in one aspect a depression may be formed around four sides of a region on which diamond is to be deposited. Such a configuration will result in a thinned semiconductor substrate bounded on one the bottom and four sides by diamond material. In another aspect, discrete pit-like depressions can be formed at the four corners of a region on which diamond is to be deposited. Such a configuration will result in a thinned semiconductor substrate bounded on the bottom by the diamond material, and having a polishing stop at each corner corresponding to the pattern of the pit-like depressions. Furthermore, the depression can be spaced to correspond to an approximate chip size. In such aspects, multiple SOD on diamond substrates may be constructed in a sheet, and subsequently broken into individual working pieces following thinning. Because the SOD substrate corresponds to the size of the desired semiconductor product, further cutting and polishing may be minimized.

By thinning the semiconductor substrate to very thin thicknesses heat may be more readily transferred into the diamond layer. While such thicknesses may vary to some extent depending on the intended use of the SOD substrate, in one aspect the uniform depth may be less than about 5 µm. In another aspect, the uniform depth may be less than about 2 µm. In yet another aspect, the uniform depth may be less than about 1 µm. Some variation in the depth of the depressions may be tolerated in certain circumstances, however, additional polishing of the substrate may be required in order to level the diamond-filled depressions to a uniform height during thinning of the semiconductor substrate.

Diamond materials have excellent thermal conductivity properties that make them ideal for incorporation into SOD devices. The transfer of heat that is present in the SOD device can thus be accelerated from the device through a diamond layer. It should be noted that the present invention is not limited as to specific theories of heat transmission. As such, in one aspect the accelerated movement of heat from the device can be at least partially due to heat movement into and through the diamond layer. Due to the heat conductive properties of diamond, heat can rapidly spread laterally through the diamond layer and to the edges of the SOD device. Heat present around the edges will be more rapidly dissipated into the air or into surrounding structures, such as heat spreaders or device supports. Because the thermal conductivity of diamond is greater that the thermal conductivity of the semiconductor materials of the SOD substrate, a heat sink is established by the diamond layer beneath the semiconductor materials. As such, heat that builds up in the semiconductor is drawn into the diamond layer and spread laterally to be discharged from the device. Such accelerated heat transfer may result in SOD devices with much cooler operational temperatures. Additionally, the acceleration of heat transfer away from the semiconductor materials not only cools the SOD device, but may also reduce the heat load on many electronic components that are spatially located near the SOD device.

In some aspects of the present invention, the edges of the diamond layer may be exposed to the air. In such aspects, the accelerated movement of heat away from the semiconductor materials may be at least partially due to heat movement from the diamond layer to air. For example, a diamond material such as diamond-like carbon (DLC) has exceptional heat emissivity characteristics even at temperatures below 100° C., and as such, may effectively radiate heat directly to the air. Many semiconductor materials that comprise the device may conduct heat much better than they emit heat. As such, heat can be conducted through the semiconductor materials to a DLC layer, spread laterally through the DLC layer, and subsequently emitted to the air along the edges. Due to the high heat conductive and radiative properties of DLC, heat movement from the DLC layer to air can be greater than heat movement from the semiconductor materials to air. Also, heat movement from the semiconductor to the DLC layer can be greater than heat movement from the semiconductor to the air. As such, the layer of DLC can serve to accelerate heat transfer away from the semiconductor layers more rapidly than heat can be transferred through the semiconductor device itself or from the semiconductor device to the air.

As has been suggested, various diamond materials may be utilized to provide accelerated heat transferring properties to an SOD device. Non-limiting examples of such diamond materials may include diamond, DLC, amorphous diamond, and combinations thereof. It should be noted, however, that any form of natural or synthetic diamond material that may be utilized to cool a semiconductor device is considered to be within the present scope.

Generally, diamond layers may be formed by any means known, including various vapor deposition techniques. Any number of known vapor deposition techniques may be used to form these diamond layers. The most common vapor deposition techniques include CVD and PVD, although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for boron nitride layers, are well known to those skilled in the art. In another aspect, PVD to techniques such as sputtering, cathodic arc, and thermal evaporation may be utilized. Further, specific deposition conditions may be used in order to adjust the exact type of material to be deposited, whether DLC, amorphous diamond, or pure diamond. It should also be noted that many semiconductor devices such as LEDs may be degraded by high temperature. Care man need to be taken to avoid damage during diamond deposition by depositing at lower temperatures. For example, if the semiconductor contains InN, deposition temperatures of up to about 600° C. may be used. In the case of GaN, layers may be thermally stable up to about 1000° C. Additionally, preformed layers can be brazed, glued, or otherwise affixed to the semiconductor layer or to the support substrate of the semiconductor device using methods which do not unduly interfere with the heat transference of the diamond layer or the functionality of the device.

An optional nucleation enhancing layer can be formed on a growth surface of the semiconductor substrate in order to improve the quality and deposition time of the diamond layer. Specifically, the diamond layer can be formed by depositing applicable nuclei, such as diamond nuclei, on the diamond growth surface of the semiconductor substrate and then growing the nuclei into a film or layer using a vapor deposition technique. In one aspect of the present invention, a thin nucleation enhancer layer can be coated upon the semiconductor substrate to enhance the growth of the diamond layer. Diamond nuclei are then placed upon the nucleation enhancer layer, and the growth of the diamond layer proceeds via CVD.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials may include, without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the thermal transmission properties of the diamond layer. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the growth surface of the semiconductor substrate or the nucleation enhancer layer may be increased in order to reduce the amount of interstitial space between diamond particles. Examples of ways to increase nucleation rates include, but are not limited to; applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 200° C. such as about 150° C. Other methods of increasing diamond nucleation will be readily apparent to those skilled in the art.

In one aspect of the present invention, the diamond layer may also be a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions that are conventional CVD deposition conditions for to diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form the diamond layer as a conformal diamond layer. The diamond growth conditions may be those conditions which are commonly used in traditional CVD diamond growth. However, unlike conventional diamond film growth, the diamond film produced using the above pretreatment steps results in a conformal diamond film that typically begins growth substantially over the entire growth surface with substantially no incubation time. In addition, a continuous film, e.g. substantially no grain boundaries, can develop within about 80 nm of growth. Diamond layers having substantially no grain boundaries may move heat more efficiently than those layers having grain boundaries.

The diamond layer may be of any thickness that would allow cooling according to the methods and devices of the present invention. Thicknesses may vary depending on the application and the semiconductor device configuration. For example, greater cooling requirements may require a thicker diamond layer. The thickness may also vary depending on the material used in the diamond layer. That being said, in one aspect a diamond layer may be less than about 250 microns. In another aspect, the diamond layer may be less than about 100 microns. In yet another aspect, the diamond layer may be less than about 60 microns. In a further aspect, the diamond layer may be from about 5 microns to about 50 microns. In yet another aspect, the diamond layer may be an adynamic diamond layer.

As has been described, the semiconductor substrate is thinned to a uniform thickness prior to depositing the semiconductor layer or layers thereon. Such a uniform thickness is obtained through the use of the diamond-filled depressions, or polishing stops. Due to the uniform depth of the depressions applied to the etch surface of the semiconductor substrate, polishing the semiconductor substrate surface opposite the diamond layer until the polishing stops are exposed will produce a thinned semiconductor substrate of a uniform thickness equal to the depth of the diamond-filled depressions. As such, very thin semiconductor substrates with a uniform depth may be produced with a reduced likelihood of damage during manufacture. In one aspect, for example, the thinned semiconductor substrate has a variance from a uniform thickness of less than 0.25 µm. In another aspect, the thinned semiconductor substrate has a variance from a uniform thickness of less than 0.1 µm. In yet another aspect, the thinned semiconductor substrate has a variance from a uniform thickness of less than 0.05 µm. In addition to thinning, the semiconductor substrate may also be polished prior to deposition of the semiconductor layer or layers. In some aspects, the thinning process may also adequately polish the semiconductor substrate.

A semiconductor layer may be deposited on the thinned semiconductor substrate using a variety of techniques known to those of ordinary skill in the art. One non-limiting example of such a technique is a MOCVD processes. The semiconductor layer may comprise any material that is suitable for forming electronic devices, semiconductor devices, or the like. Many semiconductors are based on silicon, gallium, indium, and germanium. However, suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one aspect, however, the semiconductor layer can comprise silicon, silicon carbide, gallium arsenide, gallium nitride, gallium phosphide, aluminum nitride, indium nitride, indium gallium nitride, aluminum gallium nitride, or composites of these materials. In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. It should be understood that the semiconductor layer may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As has been described, the semiconductor layer may be deposited by any method known to one of ordinary skill in the art. Various known methods of vapor deposition can be utilized to deposit such layers and that allow deposition to occur in a graded manner.

In one aspect of the present invention, the semiconductor layer may be gallium nitride (GaN). GaN semiconductor layers may be useful in constructing LEDs and other semiconductor devices. In some cases it may be beneficial to gradually transition between the semiconductor substrate and the semiconductor layer. In another aspect, the semiconductor layer may be a layer of aluminum nitride (AlN). As with the GaN layer described above, gradually transitioning between semiconductor layers may improve the functionality of the semiconductor device. Additionally, surface processing may be performed between any deposition steps in order to provide a smooth surface for subsequent deposition. Such processing may be accomplished by any means known, such as by chemical etching, polishing, buffing, grinding, etc.

The present invention also provides a variety of SOD devices. In one aspect, for example, such an SOD device may include a diamond layer having a depression, and a semiconductor substrate disposed in the depression and having a thickness of less than about 5 µm, said diamond layer surrounding and contacting the semiconductor substrate on at least 5 sides. In another aspect, the semiconductor substrate has a uniform thickness of less than about 2 µm. In yet another aspect, the semiconductor substrate has a uniform thickness of less than about 1 µm.

Figure 2:
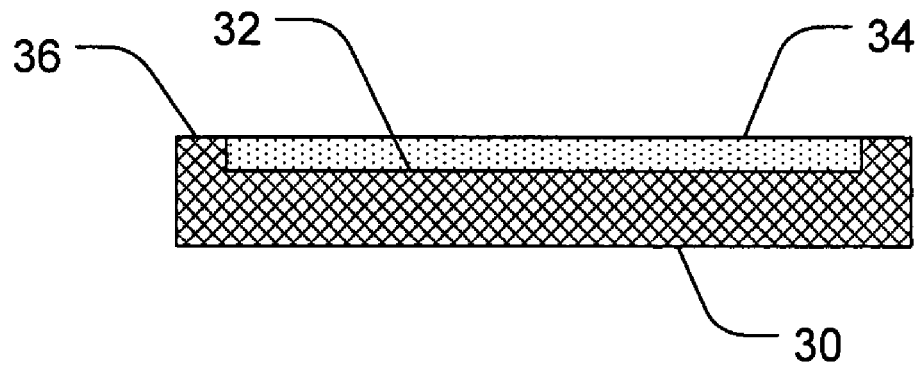
FIG. 2 is a cross sectional view of an SOD device in accordance with another embodiment of the present invention.
Figure 3:
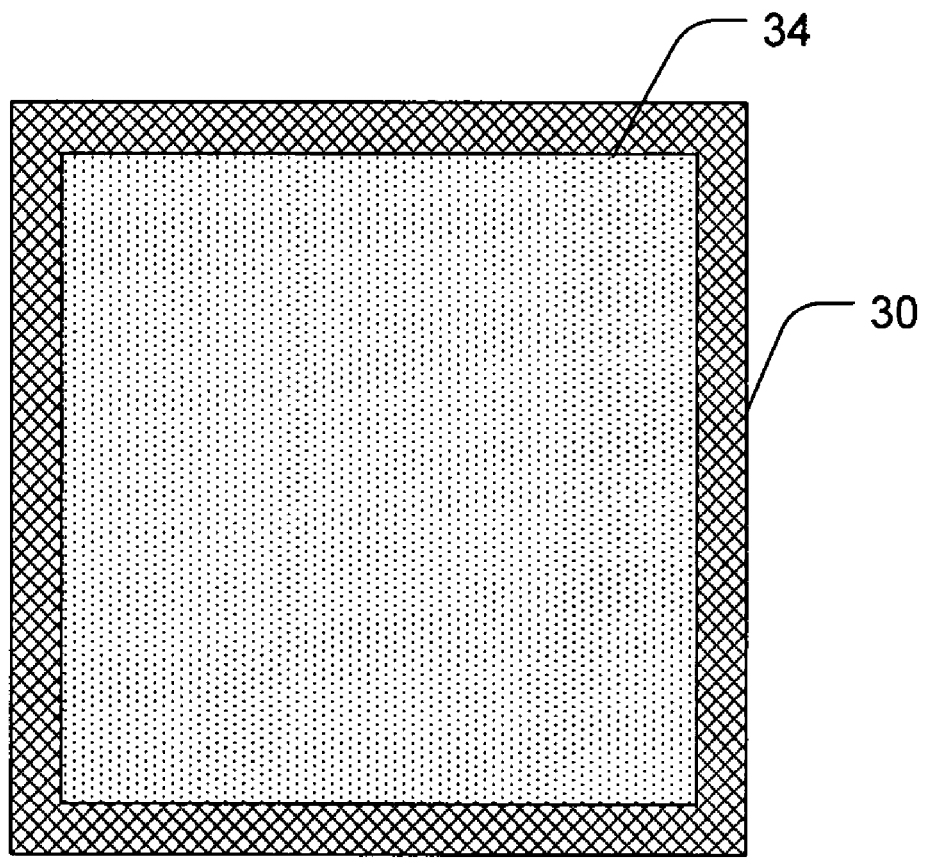
FIG. 3 is a top view of an SOD device in accordance with yet another embodiment of the present invention.

In one specific aspect, as is shown in FIGS. 2 and 3, a diamond layer 30 has a depression 32 located along one surface. The depression 32 has a thinned semiconductor substrate 34 disposed therein. The thinned semiconductor substrate 34 is surrounded on at least 5 sides by the diamond layer 30. The thinned semiconductor substrate is polished flush to the outer edge 36 of the depression along the diamond layer 30 to form a thin, uniform semiconductor substrate for further deposition of semiconductor or other materials. In one aspect, the thinned semiconductor substrate 34 has a variance from a uniform thickness of less than 0.25 µm. In another aspect, the thinned semiconductor substrate has a variance from a uniform thickness of less than 0.1 µm. In yet another aspect, the thinned semiconductor substrate has a variance from a uniform thickness of less than 0.05 µm.

What is claimed is:

1. Method of making a semiconductor-on-diamond device, comprising:
   etching depressions into an etch surface of a semiconductor substrate to a uniform depth;
   pretreating the etch surface under diamond growth conditions in the absence of a bias to form a carbon film;
   CVD depositing a conformal diamond layer onto the carbon film of the etch surface to form diamond-filled depressions; and
   thinning the semiconductor substrate at a thinning surface opposite the etch surface until the diamond filled depressions are exposed, thus forming a thinned semiconductor substrate having a thickness substantially equal to the uniform depth.

2. The method of claim 1, wherein the uniform depth is less than about 5 µm.

3. The method of claim 1, wherein the uniform depth is less than about 2 µm.

4. The method of claim 1, wherein the uniform depth is less than about 1 µm.

5. The method of claim 1, wherein the diamond layer is deposited across substantially all of the etch surface.

6. The method of claim 1, wherein thinning the semiconductor substrate further includes polishing the semiconductor substrate.

7. The method of claim 1, wherein the semiconductor substrate includes a member selected from the group boron nitride, gallium nitride, indium nitride, silicon, silicon carbide, sapphire, gallium arsenide, and combinations thereof.

8. The method of claim 1, wherein the semiconductor substrate is silicon.

9. The method of claim 1, wherein the semiconductor substrate is gallium nitride.

10. The method of claim 1, wherein the semiconductor substrate is aluminum nitride.

11. The method of claim 1, further comprising depositing a semiconductor layer on the thinning surface of the semiconductor substrate.

12. The method of claim 11, wherein the semiconductor layer is a member selected from the group consisting of silicon, silicon carbide, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof.

13. The method of claim 11, wherein the semiconductor layer is a member selected from the group consisting of aluminum nitride, boron nitride, gallium nitride, indium nitride, silicon, silicon carbide, and combinations thereof.

14. The method of claim 11, wherein the semiconductor layer is silicon.

15. The method of claim 11, wherein the semiconductor layer is gallium nitride.

* * * * *